United States Patent
Vasudivan et al.

(10) Patent No.: US 7,359,213 B2
(45) Date of Patent: Apr. 15, 2008

(54) CIRCUIT BOARD

(75) Inventors: Sunappan Vasudivan, Singapore (SG); Chee Wai Lu, Singapore (SG); Boon Keng Lok, Singapore (SG)

(73) Assignee: The Agency for Science, Technology and Research, Singapore (SG)

( * ) Notice: Subject to any disclaimer, the term of this patent is extended or adjusted under 35 U.S.C. 154(b) by 42 days.

(21) Appl. No.: 10/888,076

(22) Filed: Jul. 9, 2004

(65) Prior Publication Data

US 2006/0007662 A1    Jan. 12, 2006

(51) Int. Cl.
*H05K 1/18* (2006.01)
(52) U.S. Cl. ............... 361/763; 361/782; 361/783; 174/262
(58) Field of Classification Search ........... 174/260, 174/262–266, 52.4; 361/762–765, 767–768
See application file for complete search history.

(56) References Cited

U.S. PATENT DOCUMENTS

| | | | |
|---|---|---|---|
| 6,239,980 B1 * | 5/2001 | Fillion et al. ............ | 361/760 |
| 6,333,856 B1 * | 12/2001 | Harju .................... | 361/761 |
| 6,407,929 B1 | 6/2002 | Hale et al. | |
| 6,512,182 B2 * | 1/2003 | Takeuchi et al. ......... | 174/256 |
| 6,577,490 B2 * | 6/2003 | Ogawa et al. ........... | 361/306.1 |
| 6,586,827 B2 * | 7/2003 | Takeuchi et al. ......... | 257/687 |
| 6,618,267 B1 * | 9/2003 | Dalal et al. .............. | 361/767 |
| 6,657,523 B2 * | 12/2003 | Tarui et al. .............. | 333/246 |
| 6,724,638 B1 * | 4/2004 | Inagaki et al. .......... | 361/763 |
| 6,822,170 B2 * | 11/2004 | Takeuchi et al. ......... | 174/258 |
| 6,876,554 B1 * | 4/2005 | Inagaki et al. .......... | 361/763 |
| 2004/0001234 A1 | 1/2004 | Ho et al. | |
| 2004/0001324 A1 | 1/2004 | Ho et al. | |
| 2005/0016765 A1 * | 1/2005 | Higuchi et al. ......... | 174/258 |

FOREIGN PATENT DOCUMENTS

JP       2002261449       9/2002

* cited by examiner

*Primary Examiner*—Jeremy C. Norris
*Assistant Examiner*—Hoa C Nguyen
(74) *Attorney, Agent, or Firm*—Fulwider Patton LLP

(57) ABSTRACT

A circuit board is formed by mounting at least one passive component on a first surface of a first laminate material; interconnecting the passive component to contact traces and vias of the first laminate material; and attaching a second laminate material to the first surface of the first laminate material utilizing a lamination process, the second laminate material sheet having at least one of a recess, a through-hole or both formed therein for accommodating the passive component in the second laminate.

10 Claims, 6 Drawing Sheets

CIRCUIT BOARD

FIELD OF THE INVENTION

The present invention relates broadly to a method of forming a circuit board, and to a circuit board.

BACKGROUND

The demand for advanced electronic systems in e.g. front-end wireless communication and the increased use of the Internet has resulted in miniaturization of electronic products having more functional features. These products use a large number of passive components (e.g. resistors, capacitors and inductors). In conventional printed circuit boards, these passive components are surface mounted devices, which consume a large area thereby increasing costs. Passive components generally may take up to 60% of the printed circuit board (PCB) area thereby limiting the space available for active components (e.g. integrated circuits (IC))

On the other hand, passive components, such as bypass capacitors are generally placed as close as possible to a die or IC to increase the effectiveness of the capacitors. These capacitors and other passive components are thus often surface mounted to the die side or on the opposite side of an IC during printed circuit board assembly. FIG. 1 illustrates a cross-section of a conventional multi-layer printed circuit board assembly 10 having an IC 11, capacitors 12 located on the die side and capacitors 13 located on the opposite side of the die. The terminals of the capacitors 12, 13 are internally connected to the integrated circuit through pads 9, vias 14, and power or ground lines 15, 16.

Reducing the dimensions of the passive components may help in mounting a large number of such passive components. However, reducing the dimensions of the surface mounted passive components has an adverse effect on the electrical performance.

An alternative that is currently practiced for selected applications is embedded passive components using screen printed inks. Commonly used materials include capacitor paste and resistor inks. The density of capacitance that can be achieved using commercially available printed paste is insufficient to meet a wide range of capacitance requirements that is readily available using discrete capacitors. Printed resistor inks have poor resistance tolerance of up to 30%. In such instances, laser trimming may be used for precise resistance tolerance control for selected applications which increases costs.

Japanese Publication No. 2002261449 published on 13 Sep. 2002 in the names of SEIICHI et al. describes a method of embedding IC chips and discrete passive components by using a proprietary epoxy resin material. Interconnections between the ICs and passive components are formed by vias, which are composed of a conductive resin. The use of proprietary material and via forming process in commercial applications increases costs.

U.S. Pat. No. 6,407,929 B1 issued on 18 Jun. 2002 to AARON et al. relates to embedding discrete passive components by a lamination process. Interconnections are formed after the lamination process by drilling holes right above the component terminals and filling the holes with a conductive material.

United States Patent Publication No. 2004/0001324 A1 published on 1 Jan. 2004 in the names KWUN et al. describes a method of embedding IC chips in a through-hole cavity and discrete passive components in a PCB recess (partially formed cavity). A dielectric epoxy material is filled in the cavities, and once the epoxy is cured interconnections are formed by vias formed in the cured epoxy over the component terminals.

International (PCT) Publication No. 2004/001848 A1 pertains to a lamination process for embedding IC or discrete passive components in a PCB with cavity formed on prepreg sheets to fit the components. Interconnection are formed by drilling holes right above the component terminals and electroplating.

There are a number of concerns relating to the processes of embedding discrete passive components in the above documents. For instance, drilling holes for vias above the component terminals may introduce thermal/mechanical damage or removal of termination material. Electroplating the drilled vias over component's solder terminal may not be feasible due to concern of plating adhesion to solder surface.

It is with the knowledge the above concerns that the present invention has been conceived and is now reduced to practice.

SUMMARY

In accordance with a first aspect of the present invention there is provided a method of forming a circuit board, the method comprising mounting at least one passive component on a first surface of a first laminate material; interconnecting the passive component to contact traces and vias of the first laminate material; and attaching a second laminate material to the first surface of the first laminate material utilizing a lamination process, the second laminate material sheet having at least one of a recess, a through-hole or both formed therein for accommodating the passive component in the second laminate.

The passive component may be directly interconnected to the contact traces and vias.

The passive component may be substantially vertically interconnected to the contact traces and vias with respect to a surface plane of the first laminate material.

The attaching of the second laminate material may utilise the lamination process comprises providing a dielectric material between the first and second laminate materials.

The dielectric material may comprise one or more prepreg sheets.

The mounting of the passive component may comprise forming mounting pads on the first laminate material.

The interconnecting of the passive component may comprise providing vias in the mounting pads.

The method may further comprise mounting one or more integrated circuits (ICs) on a second surface of the first laminate material in an area substantially above individual or a cluster of the passive components.

The second laminate material may comprise contact traces for forming a multi-layered circuit board.

The method may further comprise attaching one or more further laminate materials having contact traces formed thereon to the first and second laminate materials for forming a multi-layered circuit board.

The method may comprise attaching a resin coated metal material to the first and second laminate materials for forming a multi-layered circuit board.

The laminate materials may comprise organic laminate materials.

In accordance with a second aspect of the present invention there is provided a circuit board comprising a first laminate material comprising contact traces and vias; at least one passive component mounted on a first surface of the first laminate material; interconnections formed from the passive components to the contact traces and vias of the first laminate material; and a second laminate material sheet laminated to the first surface of the first laminate material having at least one of a recess, a through-hole or both formed therein for accommodating the passive component.

The passive component may be directly interconnected to the contact traces and vias.

The passive component may be substantially vertically interconnected to the contact traces and vias with respect to a surface plane of the first laminate material.

The board may comprise a dielectric sheet between the first and second laminate materials.

The dielectric material may comprise one or more prepreg sheets.

The board may comprise mounting pads on the first laminate material for the passive component.

The board may comprise vias in the mounting pads for interconnecting the passive component to the traces.

The board may further comprise one or more integrated circuits (ICs) mounted on a second surface of the first laminate material in an area substantially above individual or a cluster of the passive components.

The second laminate material sheet may comprise contact traces.

The board may further comprise one or more further laminate materials having contact traces formed thereon and attached to the first and second laminate materials.

The board may further comprise a resin coated metal material attached to the first and second laminate materials for.

The laminate materials may comprise organic laminate materials.

BRIEF DESCRIPTION OF THE DRAWINGS

Non-limiting embodiments of the invention are described hereinafter with reference to the drawings, in which.

DETAILED DESCRIPTION OF PREFERRED EMBODIMENTS

In an example embodiment, discrete components are embedded away from the surface area of a printed circuit board. An organic core material of small thickness is fabricated using an established fabrication process. The fabricated core material in the example embodiment is designed on a two-layer printed circuit laminate having signal and ground connections which are connected by passive components mounted on mounting pads. A direct vertical connection is provided by vias formed in the mounting pad. The passive components are surface mounted on the core material and are so located as to form a group or cluster.

A second laminate material has a cavity which is formed by punching or routing. The surface area of the cavity is larger than the cluster area formed on the core material. The thickness of the second laminate is chosen to be greater than that of the discrete component in the example embodiment, so as to embed the passive components in the final assembly.

The core material and second laminate material are sandwiched together and the cluster of passive components is enclosed by the cavity with a desired clearance.

The core and second laminate materials may be sandwiched using established printed circuit lamination process employing heating and pressing. A prepreg sheet of multiple layers is provided between the core and second laminate materials in the example embodiment prior to laminating the PCB assembly. The above process can be repeated for fabricating a multi-layered printed circuit board.

The cavity of the laminated printed circuit board is filled and planarized with a resin of the prepreg sheet thereby forming embedded components within the printed circuit board. The external surface area of the laminated board is free from passive components. This surface area can be used for mounting other electronic components. An integrated circuit is subsequently mounted directly above the cavity area in the example embodiment, to form electrical connections with embedded passive components (such as bypass capacitors).

Figure 1:
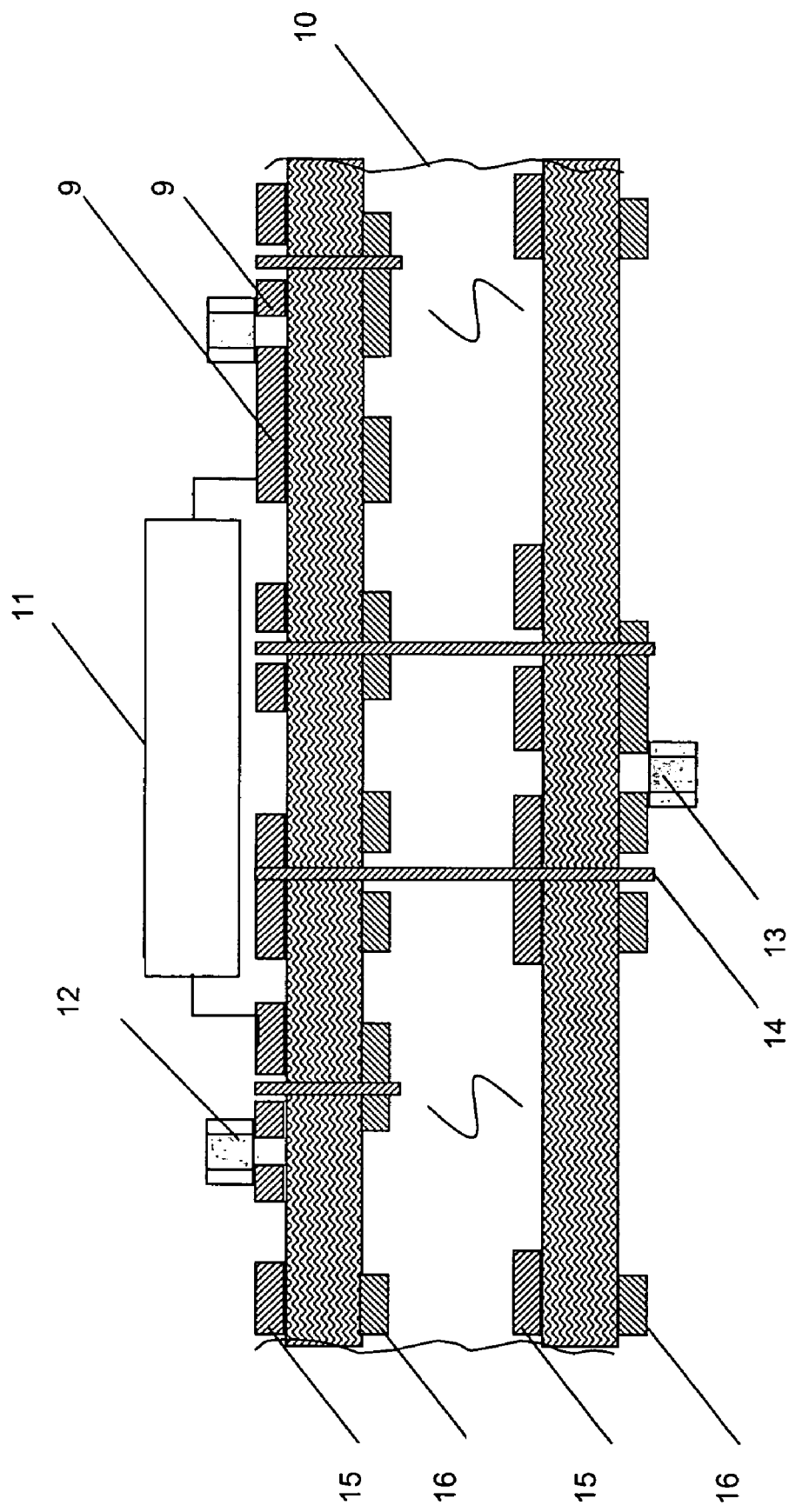
FIG. 1 shows a schematic cross-sectional view of a conventional printed circuit board assembly with integrated chip and passive components.
Figure 2A:
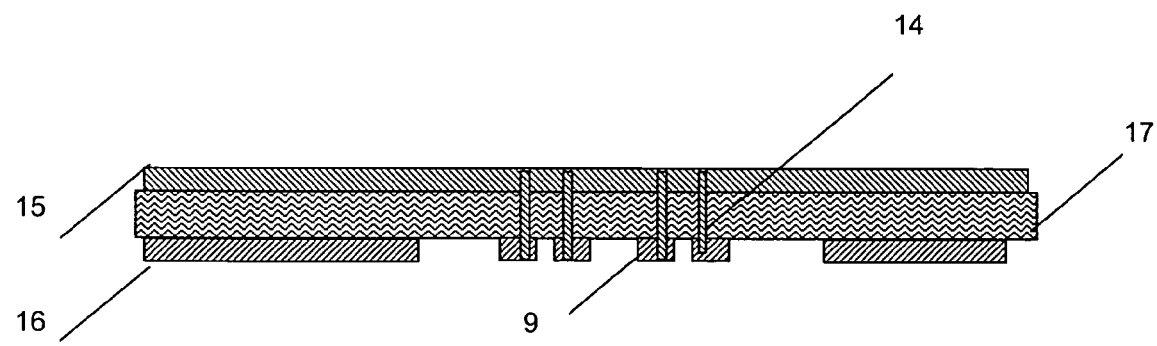
FIGS. 2A-2H show schematic cross-sectional views illustrating the process flow for fabricating embedded passive components in a printed circuit board assembly according to an embodiment of the present invention.

FIGS. 2A to 2H illustrate the detailed process flow of forming embedded passive components in a PCB according to the example embodiment of the present invention. The manufacturing steps are as follows:

Referring to FIG. 2A, a two-layer organic laminate 17 having conductive patterns (such as copper) 15 and 16 is provided with mounting pads 9 on a bottom side of the laminate 17 for assembling passive components. The material of the organic laminate 17 can be standard PCB materials, such as FR-4 epoxy glass, polyimide, benzocyclobutene, teflon, cyanate ester, bismeleimide triazine, other epoxy resins, or the like, or combinations of those materials. The thickness of the laminate 17 is so chosen to balance between mechanical stability and proximity of the passive components to an IC. The mounting pads 9 are directly and vertically (with respect to the plane of the laminate 17 taken as a horizontal plane) connected to power or ground connections 15, 16, by via-in-pads, e.g. 14, in the example embodiment.

Figure 2B:
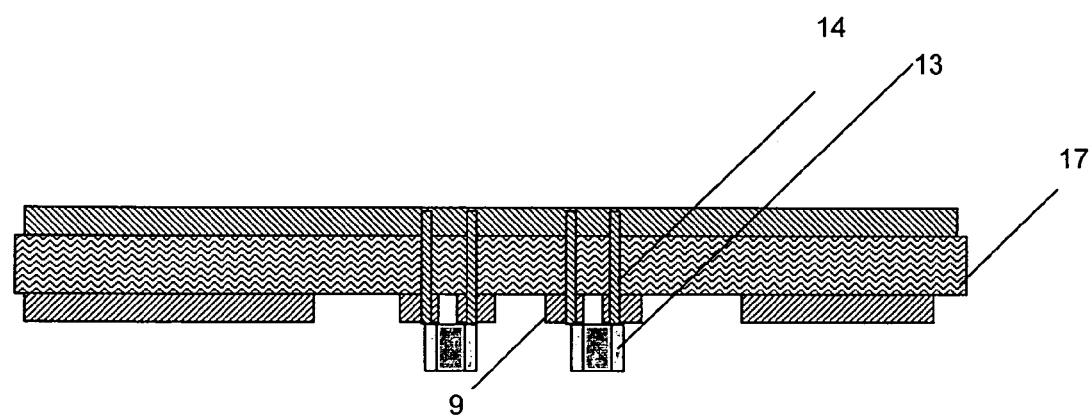

Referring to FIG. 2B, discrete passive components e.g. 13, are surface mounted on the pads 9 and in the example embodiment soldered using a reflow process. Thin profile (height) discrete passive components may be used to produce a low profile PCB in the example embodiment. The passive components can be tested at this stage.

Figure 2C:
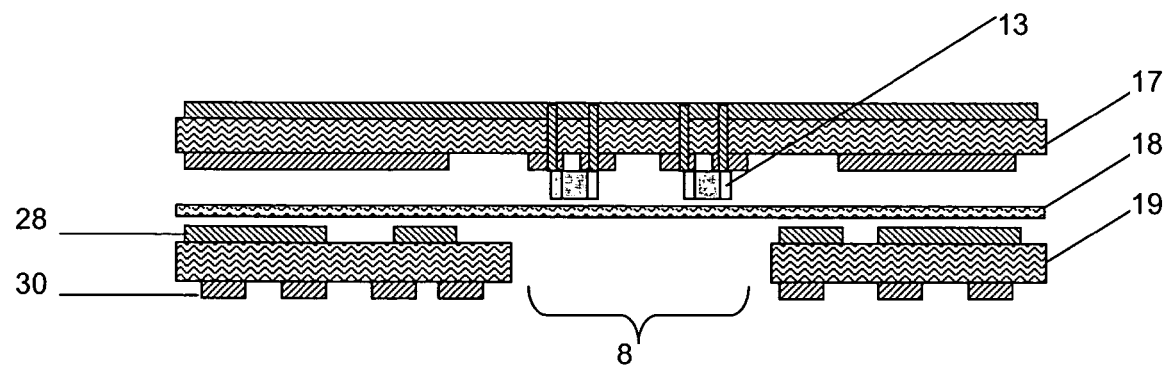

Referring to FIG. 2C, a second laminate material 19 having a thickness (e.g. 0.1~0.2 mm) slightly larger than the height of the passive components e.g. 13 is placed adjacent to the first laminate material 17. The laminate material 19 has conductive patterns, e.g. 28, 30, formed on both sides. By punching or routing, a cavity 8 is provided in the second laminate material 19, and disposed directly below the passive components 13 of the laminate material 17. The area of the cavity 8 is slightly larger than the cluster area of the components e.g. 13 formed on the first laminate material 17. A multi-layered prepreg sheet 18 is placed between the core laminate material 17 and the second laminate material 19 in the example embodiment, prior to the lamination process. The number of prepreg sheets is dependent on the thickness of the second laminate material 19 and the number of passive components e.g. 13.

Figure 2D:
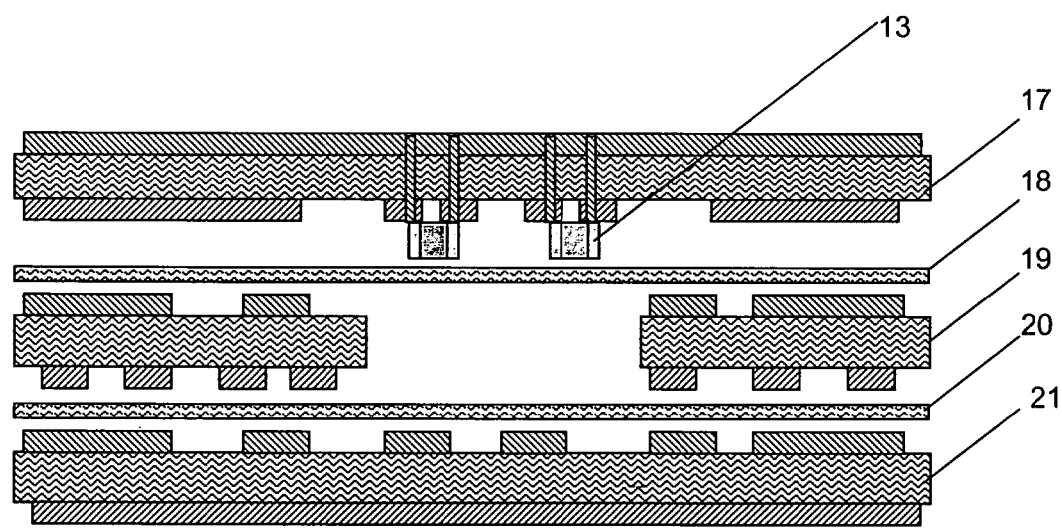

Referring to FIG. 2D, a multi-layered printed circuit lamination is formed in the example embodiment by adding another pair of a prepreg sheet 20 and a laminate material 21. The laminate material 21 has conductive patterns formed on the upper side. The process can be repeated depending on the number of printed circuit board layers required. In another embodiment, resin coated copper (RCC) foil may be used instead of the pair of the prepreg sheet 20 and the laminate material 21.

Figure 2E:
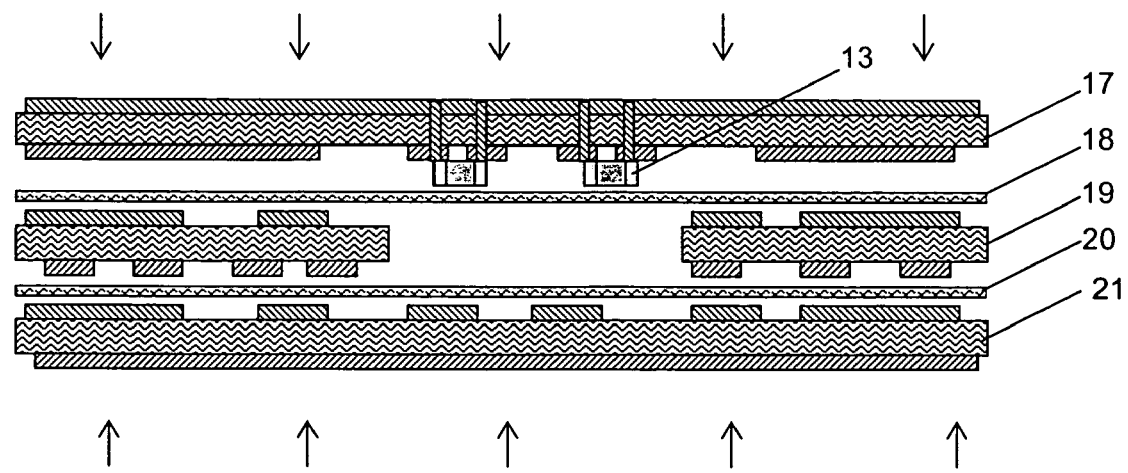

Referring to FIG. 2E, a multi-layered PCB in the example embodiment with embedded discrete components e.g. 13 is formed by a lamination process by appropriate heating and pressing of the top and the bottom surfaces of the structure formed in the previous step.

Figure 2F:
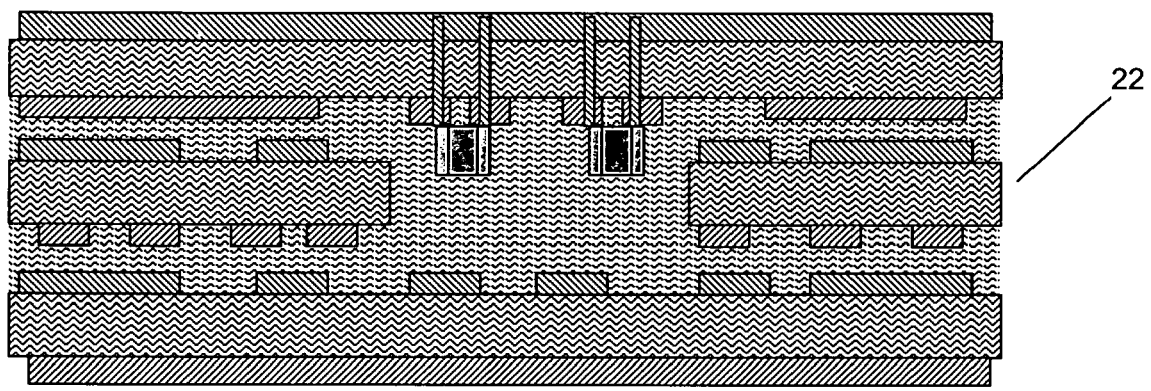

Referring to FIG. 2F, laminated assembly 22 is completed with embedded passive components.

Figure 2G:
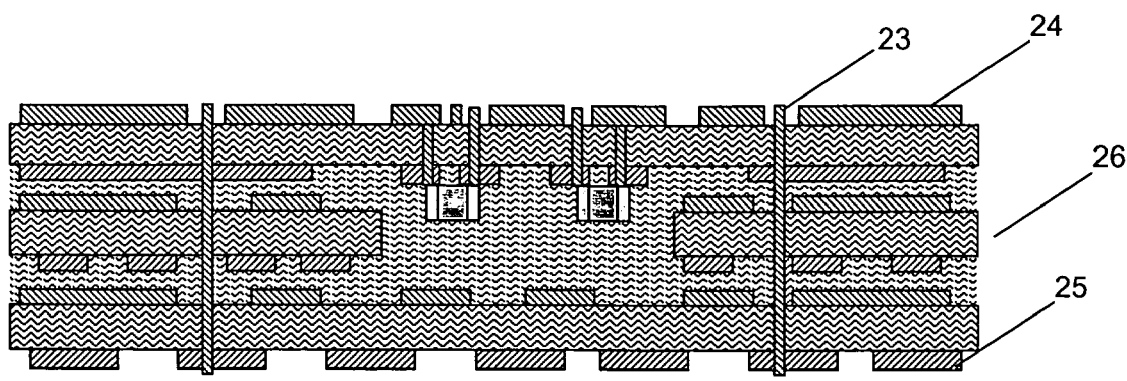

Referring to FIG. 2G, through via holes 23 are formed and plated to form connections between the top, bottom and internal layers. The via holes 23 may be formed by drilling (e.g. mechanical or laser drilling) The top and bottom surfaces of the laminated assembly 22 (FIG. 2F) are further processed by known etching methods in the example embodiment to provide metal pads 24, 25 for component surface mounting, thereby forming the final PCB 26 having embedded discrete components e.g. 13.

Figure 2H:
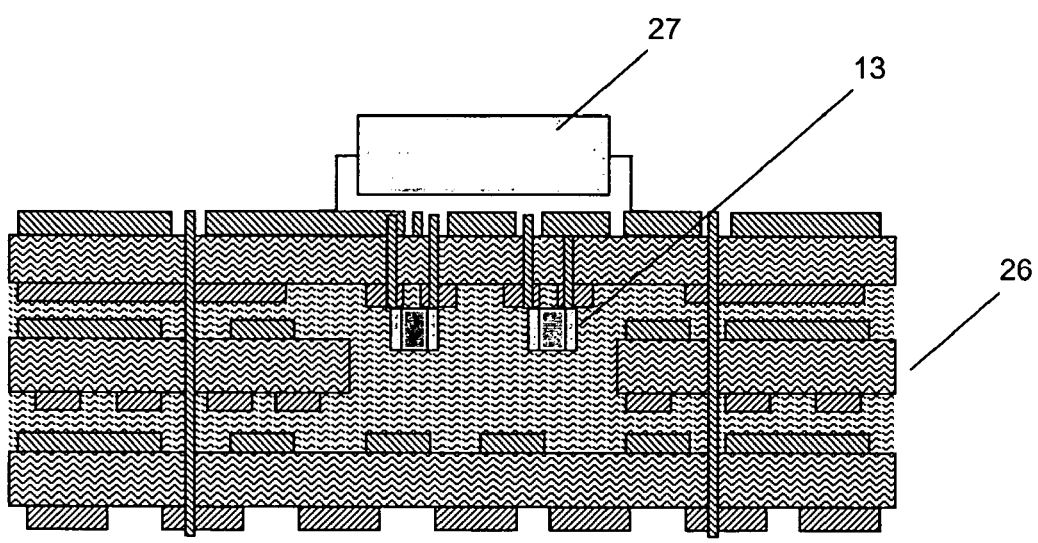

Referring to FIG. 2H, an IC 27 is surface mounted on top of the PCB 26. The embedded passive components e.g. 13 are electrically connected to the IC 27. Other components may be mounted on the top or bottom layers of PCB 26.

Figure 3:
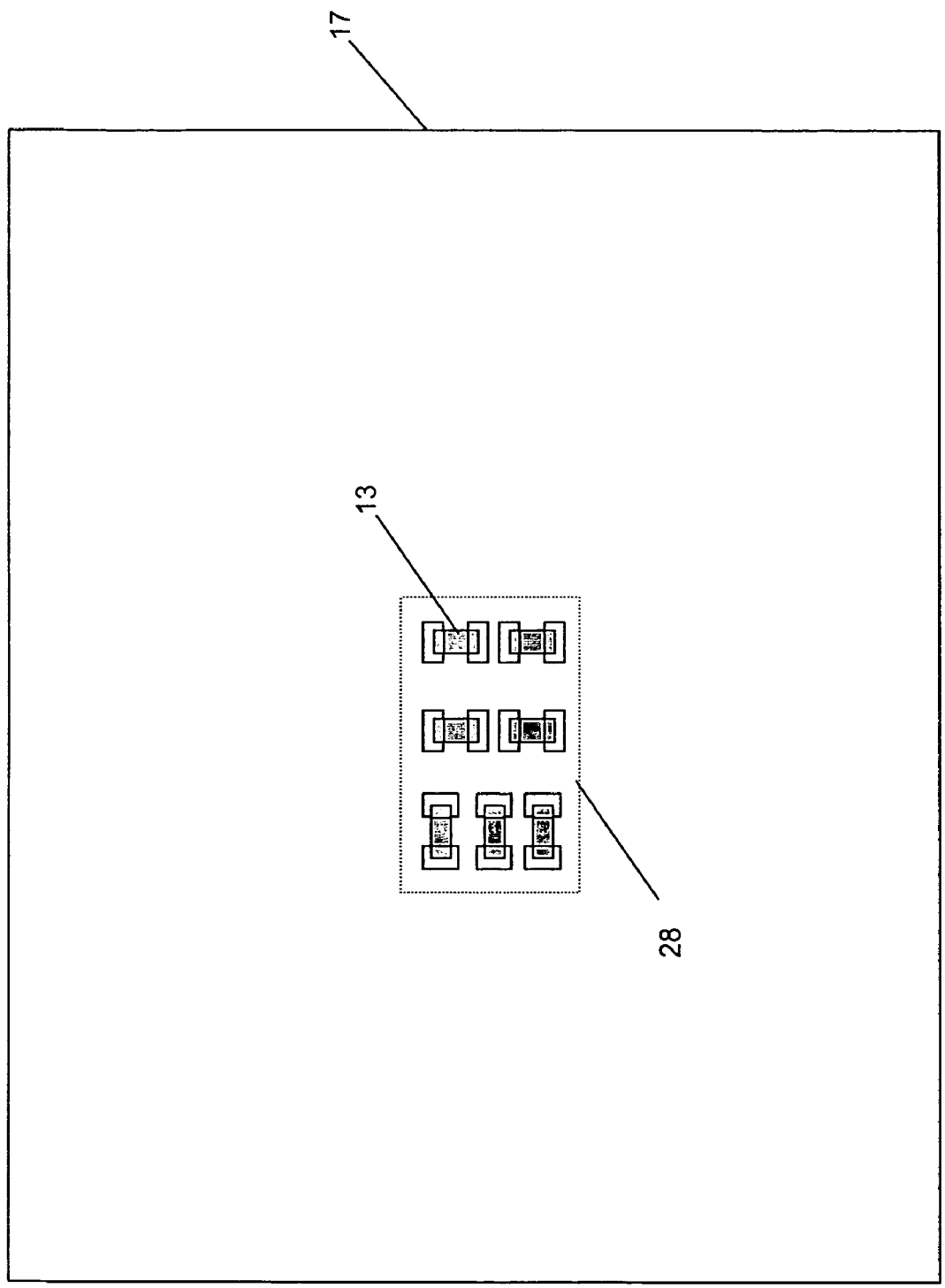
FIG. 3 is a schematic bottom view of FIG. 2B.

FIG. 3 is the bottom view of the passive component assembly shown in FIG. 2B, illustrating a cluster area 28 of the passive components e.g. 13, in the example embodiment.

The example embodiment makes use of known component assembly processing and printed circuit fabrication steps. By embedding passive components such as bypass capacitors, more surface area on top and bottom layers may be available for mounting other electronic components. This results in increased functional features and reduced PCB size.

The example embodiment also provides a less inductive interconnection between the embedded passive components, e.g. capacitors, which, in turn, increases the self-resonant frequency and extends the decoupling frequency range in broadband applications. The example embodiment facilitates increased routing space on the signal layers by direct vertical interconnection, in conjunction with co-location of the passive components with associated, surface mounted components such as ICs.

It will be appreciated by a person skilled in the art that numerous variations and substitutions may be made to the embodiments described without departing from the spirit or scope of the present invention. The example embodiments are, therefore, to be regarded as illustrative only, and not restrictive on the scope of protection sought.

We claim:

1. A circuit board comprising:
   a first single layer dielectric laminate material sheet having preformed thereon contact traces on first and second surfaces of the single layer dielectric laminate material sheet and vias extending into via-in-pad contact pads on the first surface of the single layer dielectric laminate material sheet;
   at least one passive component mounted on the via-in-pad contact pads preformed on the first surface of the first single layer dielectric laminate material sheet;
   interconnections formed from the passive components to the contact traces of the first single layer dielectric laminate material sheet by the vias extending into the via-in-pad contact pads; and
   a second laminate material sheet laminated to the first surface of the first single layer dielectric laminate material sheet and having at least one of a recess, a through-hole or both formed therein for accommodating the passive component;
   wherein a dielectric material laminating the first and second laminate material sheets to each other embeds at least a portion of the passive component; and
   wherein a second surface of the first single layer dielectric laminate material sheet on which the contact traces are formed is exposed as a mounting surface of the circuit board for mounting an active component.

2. The board as claimed in claim 1, wherein the passive component is directly interconnected to the contact traces on the second surface of the first single layer laminate material sheet by the via-in-pad connections extending into the respective contact pads.

3. The board as claimed in claim 2, wherein the passive component is substantially vertically interconnected to the contact traces on the second surface of the first single layer laminate material sheet with respect to a surface plane of the first single layer dielectric laminate material sheet.

4. The board as claimed in claim 1, further comprising one or more integrated circuits (ICs) mounted on the second surface of the first single layer dielectric laminate material sheet in an area substantially above individual or a cluster of the passive components.

5. The board as claimed in claim 4, wherein the passive components are interconnected to the one or more integrated circuits (ICs) at only one contact side of the respective passive components.

6. The board as claimed in claim 1, wherein the second laminate material sheet comprises contact traces.

7. The board as claimed in claim 1, further comprising one or more further laminate materials having contact traces formed thereon and attached to the second laminate material sheet.

8. The board as claimed in claim 7, wherein the first single layer dielectric laminate material sheet, the second laminate material sheet and the one or more further laminate materials are laminated in a single step lamination process to form the board.

9. The board as claimed in claim 1, further comprising a resin coated metal material attached to the second laminate material sheet.

10. The board as claimed in claim 1, wherein the laminate material sheets comprise organic laminate materials.

* * * * *